US008638094B2

(12) United States Patent
Grodzki

(10) Patent No.: US 8,638,094 B2
(45) Date of Patent: Jan. 28, 2014

(54) METHOD AND MAGNETIC RESONANCE DEVICE FOR IMAGING OF PARTICLES

(75) Inventor: David Grodzki, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 335 days.

(21) Appl. No.: 13/020,280

(22) Filed: Feb. 3, 2011

(65) Prior Publication Data

US 2011/0187366 A1    Aug. 4, 2011

(30) Foreign Application Priority Data

Feb. 4, 2010   (DE) .......................... 10 2010 001 597

(51) Int. Cl.
*G01V 3/00*      (2006.01)

(52) U.S. Cl.
USPC .......................................... 324/307; 324/309

(58) Field of Classification Search
USPC ................................. 324/307, 309, 312, 314
See application file for complete search history.

(56) References Cited

U.S. PATENT DOCUMENTS

| 7,480,525 | B2 * | 1/2009 | Reeder et al. ................. 600/410 |
| 7,502,640 | B2 * | 3/2009 | Conolly et al. ............... 600/411 |
| 7,809,424 | B2 * | 10/2010 | Cunningham et al. ........ 600/411 |
| 8,022,699 | B2 * | 9/2011 | Warmuth ...................... 324/307 |
| 2005/0261575 | A1 | 11/2005 | Conolly et al. |
| 2009/0315558 | A1 | 12/2009 | Balchandani et al. |

OTHER PUBLICATIONS

"Self-Refocused Spatial-Spectral Pulse for Positive Contrast Imaging of Cells Labeled with SPIO Nanoparticles," Balchandani et al., Magnetic Resonance in Medicine, vol. 62 (2009) pp. 183-192.
"Passive tracking Exploiting Local Signal Conservation: The White Marker Phenomenon," Seppenwoolde et al., Magnetic Resonance in Medicine, vol. 50 (2003) pp. 784-790.
"Positive Contrast Magnetic Resonance Imaging of Cells Labeled with Magnetic Nanoparticles," Cunningham et al., Magnetic Resonance in Medicine, vol. 53 (2005) pp. 999-1005.
"Positive Contrast Visualization of Iron Oxide-Labeled Stem Cells using Inversion-Recovery With ON-Resonant Water Suppression (IRON)," Stuber et al., Magnetic Resonance in Medicine, vol. 58 (2007) pp. 1072-1077.

* cited by examiner

*Primary Examiner* — Louis Arana
(74) *Attorney, Agent, or Firm* — Schiff Hardin LLP

(57) ABSTRACT

In a magnetic resonance method and apparatus for imaging a particle that is located in an examination subject, a pulse sequence is emitted that includes an excitation pulse that generates a transverse magnetization of the examination subject from a magnetization appearing in a basic magnetic field, so the particle causes a magnetic interference field in the applied basic magnetic field in a magnetic resonance measurement. After the excitation pulse, at least one spectrally selective refocusing pulse is generated in a non-resonant frequency range at the generation of a spin echo.

10 Claims, 4 Drawing Sheets

METHOD AND MAGNETIC RESONANCE DEVICE FOR IMAGING OF PARTICLES

BACKGROUND OF THE INVENTION

1. Field of the Invention

The present invention concerns a method to image a particle that is located in an examination subject as well as a magnetic resonance device for this. In particular, the invention concerns the imaging of a particle that causes a magnetic interference field in an applied basic magnetic field during the acquisition of magnetic resonance data.

2. Description of the Prior Art

Magnetic resonance tomography is a wide-spread method for graphical representation of structures inside a body of a patient. To generate a magnetic resonance signal, in general protons of hydrogen molecules are excited that have been organized in a prepared magnetic state. Decay of this excitation induces a magnetic resonance signal in an acquisition coil. The magnetic resonance signal is thus dependent on (among other things) the density of the protons of the hydrogen molecules. A low magnetic resonance signal thus is obtained from regions to be imaged that have a low proton density (for example from air-filled regions or from bones), which leads to representation of the corresponding regions as a dark location in the magnetic resonance images. However, such dark locations in magnetic resonance images can also be caused by other mechanisms, for example by local magnetic fields that are caused by magnetically active substances. These local magnetic fields lead to a dephasing of the excited magnetization and thus generate what is known as a hypointense contrast.

This hypointense contrast can be utilized to show probes in the form of particles into which the magnetically active substances are integrated. Such particles have a number of uses in clinical routines and in research, for example in the field of pharmaceutical carrier systems. Due to their magnetic activity, these magnetically active substances can cause a magnetic interference field, for example a dipole field, upon the application of the basic magnetic field of a magnetic resonance measurement, so they are imaged (mapped) with hypointense contrast and consequently can be localized. Particularly in T2*-weighted gradient echo sequences, the disruption of the homogeneous basic magnetic field leads to a signal loss. In spin echo sequences, these interferences additionally lead to susceptibility artifacts. A problem in this type of imaging of particles is that the hypointense image regions cannot be unambiguously associated with the particles since—as described above—there are multiple causes for a poor signal and the corresponding dark image regions.

Therefore, methods have been proposed that generate a hyperintense contrast. These methods utilize the magnetic dipole field of the particles that produces both magnetic field gradients and a change of the proton Larmor frequency in the immediate environment. A resonance region of proton signals of protons bound in hydrogen molecules is expanded by the interference field.

A spin echo-based, spectral method for hyperintense measurement of the magnetic interference particles is described in "Positive contrast visualization of iron oxide-labelled stem cells using inversion-recovery with ON-resonant water suppression (IRON)", M. Stuber et. al., Magn. Reson. Med, 58:1072-1077, November 2007. Proton signals of protons bound in fat and/or water molecules are hereby inverted and/or suppressed via spectrally selective inversion pulses before a beginning of a magnetic resonance measurement. A T1 dependency is created that leads to the situation that substances with an inhomogeneous time constant T1 cannot be sufficiently suppressed. However, these methods have the disadvantage that the inversion pulses in the spectral space have only an approximation of an ideal box shape and are fuzzy specifically at edges. This leads to the situation that for the most part either a spectrally broadband saturation takes place, such that non-resonant signals are saturated as well, or a narrowband saturation takes place such that too much signal of the undisrupted water protons remains.

An additional spin echo-based method is described in "Positive contrast magnetic resonance imaging of cells labeled with magnetic nanoparticles", C. H. Cunningham, Magn. Reson. Med., 53:999-1005, May 2005, in which only selected non-resonant regions to the left and/or right around the proton signal of protons that are bound in water molecules are excited by an excitation pulse. However, this excitation pulse is very fuzzy in the spectral space.

SUMMARY OF THE INVENTION

An object of the present invention is to provide a method in which an improved imaging of the magnetically active particles can be achieved.

The invention proceeds from a method for imaging of a particle that is located in an examination subject, with an imaging magnetic resonance measurement that comprises a pulse sequence with an excitation pulse that is provided for a generation of a transverse magnetization of the examination subject from a magnetization appearing in a basic magnetic field, so the particle causes a magnetic interference field in the applied basic magnetic field in a magnetic resonance measurement.

In accordance with the invention, after the excitation pulse at least one spectrally selective refocusing pulse is generated in a non-resonant frequency range at a generation of a spin echo. The excitation pulse is advantageously formed by a broadband excitation pulse. A non-resonant frequency range in this context means frequency range that is arranged at least partially next to and/or outside of a resonance frequency range of a resonance signal of protons, for example protons bound in water molecules or fat molecules. The spectrally selective refocusing pulse is advantageously formed by a 180° pulse that produces a 180° rotation of the protocol spin so that the sign of a magnetization of the proton spins reverses in the y-direction. The interference with the basic magnetic field that is caused by the particle produces an interference signal in the magnetic resonance measurement that, given a broadband refocusing or a broadband spin echo, is at least partially superimposed on a resonance frequency of the protons bound in water molecules and leads to a widening (expansion) of the resonance signal. An advantageous representation and/or an advantageous detection of the particles can be achieved in this embodiment according to the invention, since the magnetic resonance signal is composed only of signals from the refocused regions and thus covers a larger contrast range in the acquired magnetic resonance images. Moreover, multiple spectrally selective refocusing pulses can be generated that are emitted after the excitation, and thus different regions around the resonance frequency range are respectively selectively acquired and imaged.

Furthermore, in accordance with the invention the spectrally selective refocusing pulse is generated with refocusing frequencies within a refocusing frequency range that is arranged directly next to a resonance frequency range. An advantageous division of signals of the magnetically active particles that are superimposed on the resonance signals (in particular signals from a resonance frequency range of protons bound in water molecules) from the resonance signals can hereby be achieved. A magnetic resonance image can additionally be reconstructed by additionally suppressing only signals with refocusing frequencies from the refocusing frequency range contribute and contributions and/or signals from the refocusing frequency range. The refocusing frequencies can be lower and/or higher than resonance frequencies of the resonance frequency range. The refocusing frequency range advantageously corresponds to the frequency range of the particles with the magnetically active substances.

In another embodiment of the invention, at least two refocusing pulses with at least partially different refocusing frequency ranges are generated after the excitation pulse. Multiple spin echoes with a different spectral selection can be generated after an excitation. In addition to this, multiple magnetic resonance images can be generated with only a single excitation pulse.

The resonance frequency range essentially includes resonance frequencies of protons bound in water, so an advantageous signal division of the signals of the protons bound in water from the signals of the particles with the magnetically active substances can be achieved.

A normal—in particular anatomical—magnetic resonance contrast of the examination subject can advantageously be generated by emitting at least one additional refocusing pulse that is formed by a broadband refocusing pulse is emitted. In this context, a broadband refocusing pulse means a refocusing pulse that covers a large and/or wide spectral refocusing frequency range. The large and/or wide spectral refocusing frequency range can include both non-resonant frequency ranges and resonant frequency ranges, in particular the resonance frequency range of protons bound in water.

Furthermore, the excitation pulse can be selectively limited to the non-resonant frequency range. An advantageous excitation thus can be achieved outside of a resonance frequency range (for example outside of the resonance frequency range of protons bound in water molecules), and thus signals from the resonance frequency range are suppressed.

Furthermore a suppression pulse can be emitted that at least partially suppresses signals of a resonance frequency range so that essentially exclusively signals that lie outside of the resonance frequency range contribute to the magnetic resonance imaging. The suppression pulse is advantageously emitted before the beginning of the magnetic resonance measurement, in particular the beginning of the excitation pulse. The suppression pulse can be formed by an inversion pulse (in particular a spectrally selective inversion pulse) that is tuned (matched) to the resonance frequency range of protons that are bound in fat molecules and/or water molecules that inverts signals of the protons bound in fat and/or water molecules.

Furthermore, combined image data can be determined by adding or subtracting image data for at least two different, spectrally selective refocusing pulses. The contrast of a representation can advantageously be increased by targeted addition or subtraction of the image data for different refocusing pulses.

The particle can be formed by a magnetically active particle that embodies iron oxide. The particle can in particular be formed as a superparamagnetic nanoparticle of iron oxide. Naturally, an imaging of particles with different structure and/or different composition that cause a magnetic interference field upon application of the basic magnetic field is possible at any time.

The invention also embodies a magnetic resonance device that is designed for imaging a particle that is located in an examination subject by the acquisition of magnetic resonance data. For this purpose, the magnetic resonance device has a magnet that is designed for an application of a basic magnetic field; a radio-frequency coil unit that is designed for a radiation of radio-frequency pulses; a gradient unit that is designed to shift magnetic field gradients; and a control unit that is designed to control the magnet, the radio-frequency coil unit and the gradient unit, and that controls an emission of an excitation pulse of a pulse sequence for a generation of a transversal magnetization of the examination subject from a magnetization arising in a basic magnetic field.

The control unit controls at least one spectrally selective refocusing pulse that is generated after the excitation pulse at a generation of a spin echo in a non-resonant frequency range. An advantageous representation and/or an advantageous detection of the particle can be achieved since the magnetic resonance signal is composed only of signals from the refocused regions and thus covers a large contrast range in the acquired magnetic resonance images. Moreover, multiple spectrally selective refocusing pulses can be generated that are emitted after the excitation, and thus different ranges around the resonance frequency range can be selectively acquired and imaged.

DESCRIPTION OF THE PREFERRED EMBODIMENTS

A method and a magnetic resonance device 1 to image magnetically active particles that generate an interference field (for example a dipole field) in an applied basic magnetic field $B_0$ are explained in more detail using the embodiments of the present invention that are explained in the following. The particles are formed by magnetically active particles that are or include iron oxide.

Figure 1:
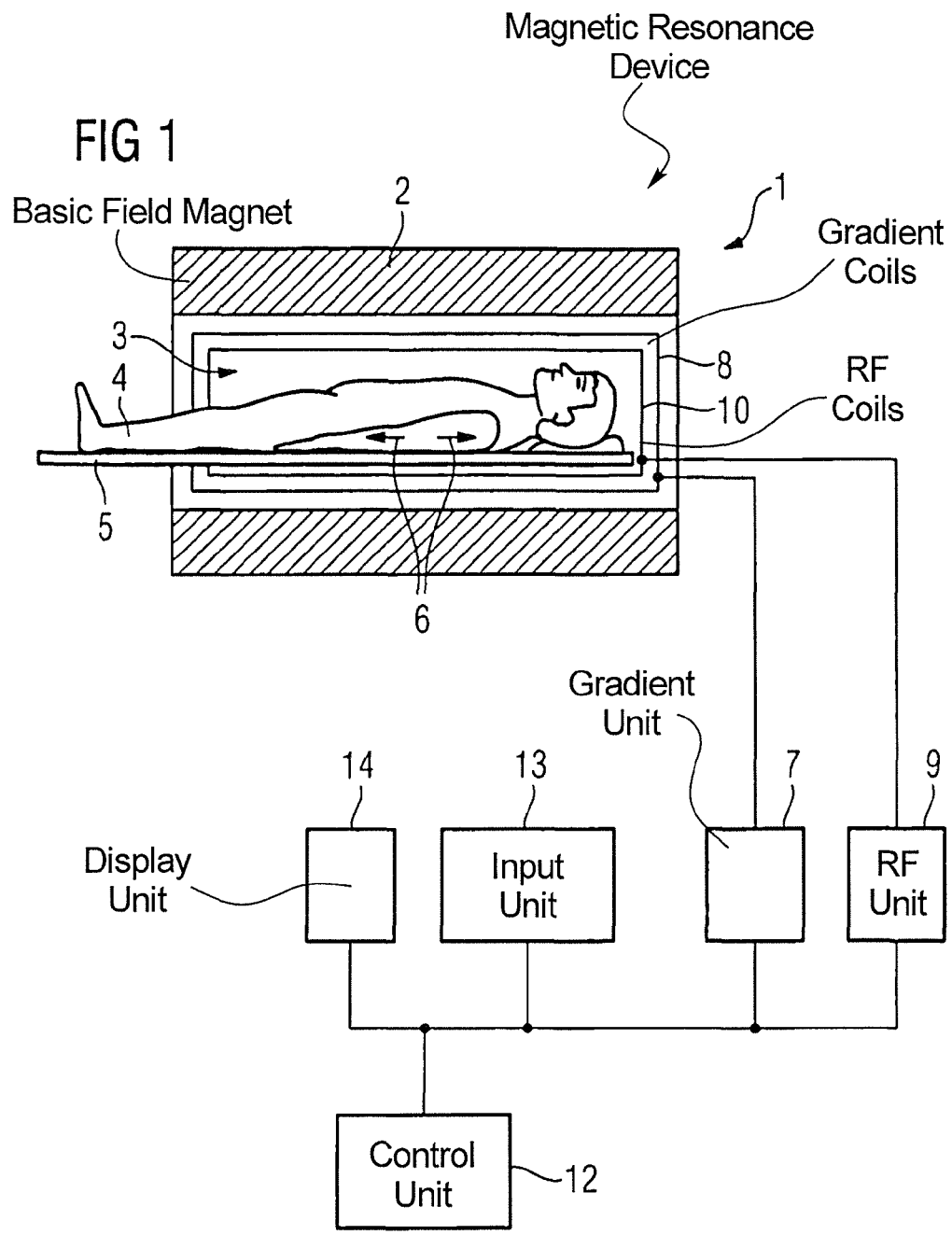
FIG. 1 shows a magnetic resonance device according to the invention in a schematic representation.

The magnetic resonance device 1 according to the invention is schematically depicted in FIG. 1. The magnetic resonance device 1 has a basic field magnet 2 that generates the basic magnetic field $B_0$. The magnetic resonance device 1 additionally has a cylindrical acquisition region 3 to accommodate a patient 4, which acquisition region 3 is surrounded by a magnet 2 in a circumferential direction of the acquisition region 3. An examination subject (here a patient 4) can be shifted into the acquisition region 3 along a feed direction 6 (as this is indicated by arrows in FIG. 1) by means of a patient bed 5 of the magnetic resonance device 1. The magnetic resonance device 1 furthermore has a gradient unit 7 and gradient coils 8 to generate magnetic field gradients that are used for an imaging and a spatial coding. The gradient coils 8 are controlled by means of the gradient unit 7.

Furthermore, the magnetic resonance device 1 has radio-frequency (RF) coils 10 and a radio-frequency coil unit 9 to excite a departure of the nuclear spins from the orientation produced by the basic magnetic field $B_0$ generated by the magnet 2. The radio-frequency coils 10 are controlled by the radio-frequency coil unit 9 and radiate a radio-frequency field (for example in the form of an excitation pulse 15 formed by a radio-frequency pulse) in an examination space that is essentially formed by the acquisition region 3. The magnetization is deflected out of its steady state. The excitation pulses are radiated with different flip angles that, for example, are between more than 0° and 90°. By deflection of the magnetization appearing in the basic magnetic field $B_0$ (for example in the z-direction) a transversal magnetization is generated (for example in the x/y-plane) whose decay can be detected as induction by means of acquisition coils. The acquisition coils are formed by the radio-frequency coils 10. Naturally it is similarly possible that the magnetic resonance device 1 has separate acquisition coils, for example head coils, body coils and/or additional acquisition coils that appear to be reasonable to those skilled in the art.

The magnetic resonance device 1 has a control unit 12 to control the magnet 2, the gradient unit 7 and to control the radio-frequency coil unit 9. The control unit centrally controls the magnetic resonance device 1, for example the implementation of a predetermined imaging gradient echo sequence. A selection of an imaging sequence to be implemented can take place with an input unit 13 of the magnetic resonance device 1. Control information (for example imaging parameters) and reconstructed magnetic resonance images can be displayed on a display unit 14 of the magnetic resonance device 1. Magnetic resonance images are additionally reconstructed from the acquired magnetic resonance signals by means of the control unit 12. The control unit 12 is additionally provided for additional image processing steps, such as a combination of data of two different magnetic resonance images into a contrast-enhanced magnetic resonance image.

The magnetic resonance device 1 schematically depicted in FIG. 1 can naturally include additional components that magnetic resonance devices 1 conventionally has. A general functionality of a magnetic resonance device 1 is known to those skilled in the art, such that a more detailed description of the general components is not necessary.

Figure 2:
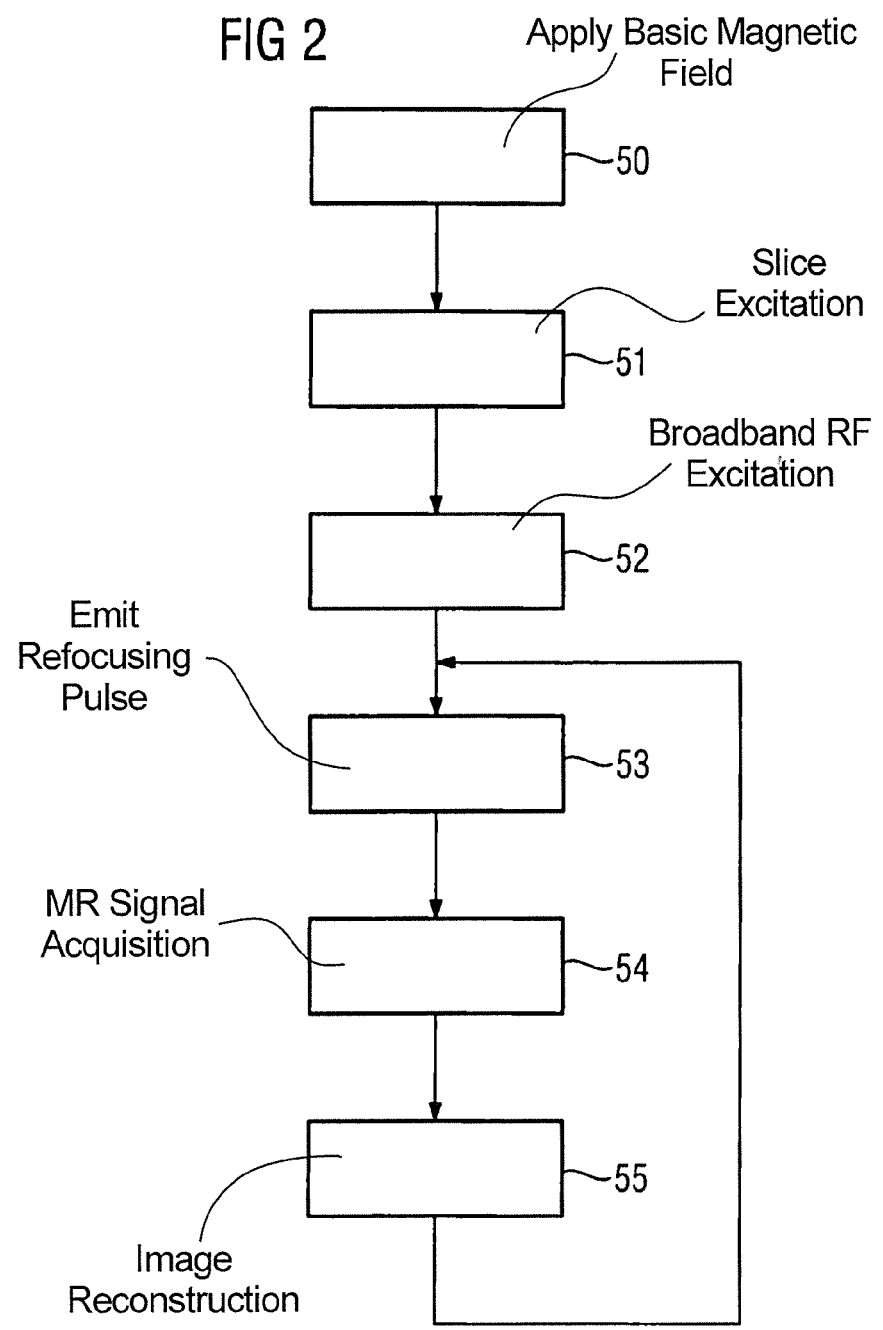
FIG. 2 shows a method according to the invention in a schematic representation.

A method workflow of the method according to the invention for imaging of magnetically active particles with a magnetic resonance measurement is presented in FIG. 2. In a first step the application 50 of the basic magnetic field $B_0$ takes place in the examination space by means of the magnet 2. The patient 4 or the examination subject in which the particles to be imaged are located is arranged in the examination space, and therefore in the basic magnetic field $B_0$.

Figure 3:
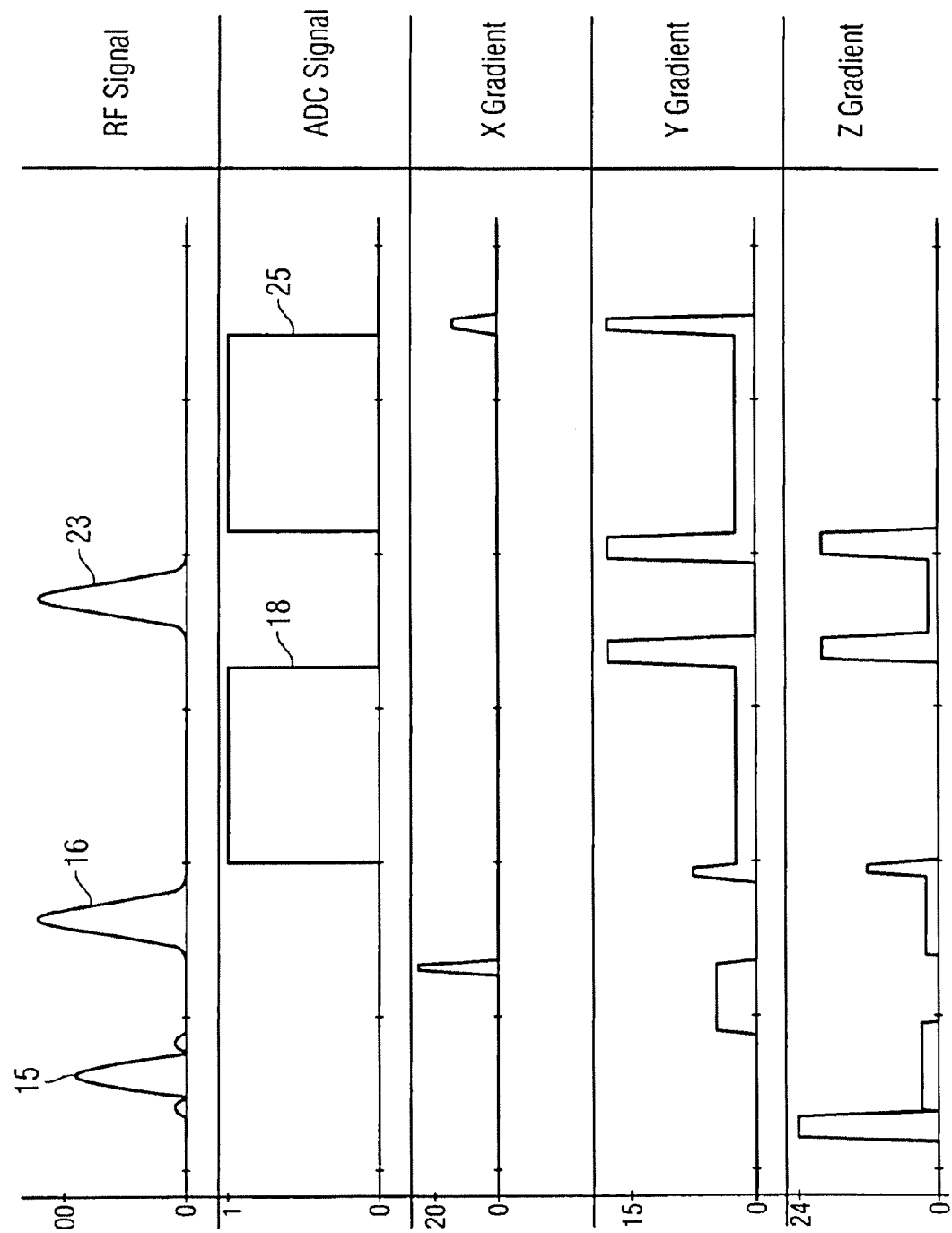
FIG. 3 shows a pulse sequence of the magnetic resonance device.

The magnetic resonance measurement (scan) includes activating a pulse sequence that is shown in FIG. 3. With regard to a shifting of gradients in the x-, y- and z-direction the pulse sequence is formed by a standard pulse sequence that is known to those skilled in the art. The pulse sequence is formed by a spin echo sequence and is controlled by the control unit 12. At the beginning of the pulse sequence, for a targeted imaging of a slice, slice selection gradients are shifted (for example in the z-direction) in a slice selection step 51. In an excitation step 52 an excitation pulse 15 is subsequently generated (FIG. 3) and radiated into the examination space to deflect the magnetization appearing in the basic magnetic field $B_0$. The excitation pulse 15 is formed by a broadband radio-frequency pulse that covers a broad frequency range. In ranges in which (due to the applied slice selection gradients) a Larmor frequency of the precessing proton spins coincides with a frequency of the radiated excitation pulse 15, the magnetization is therefore at least partially aliased in the x/y-plane and thus generates a transverse magnetization. Further pulses and/or gradients can additionally be shifted after the excitation pulse, for example a dephasing gradient and/or frequency coding gradients.

Figure 4:
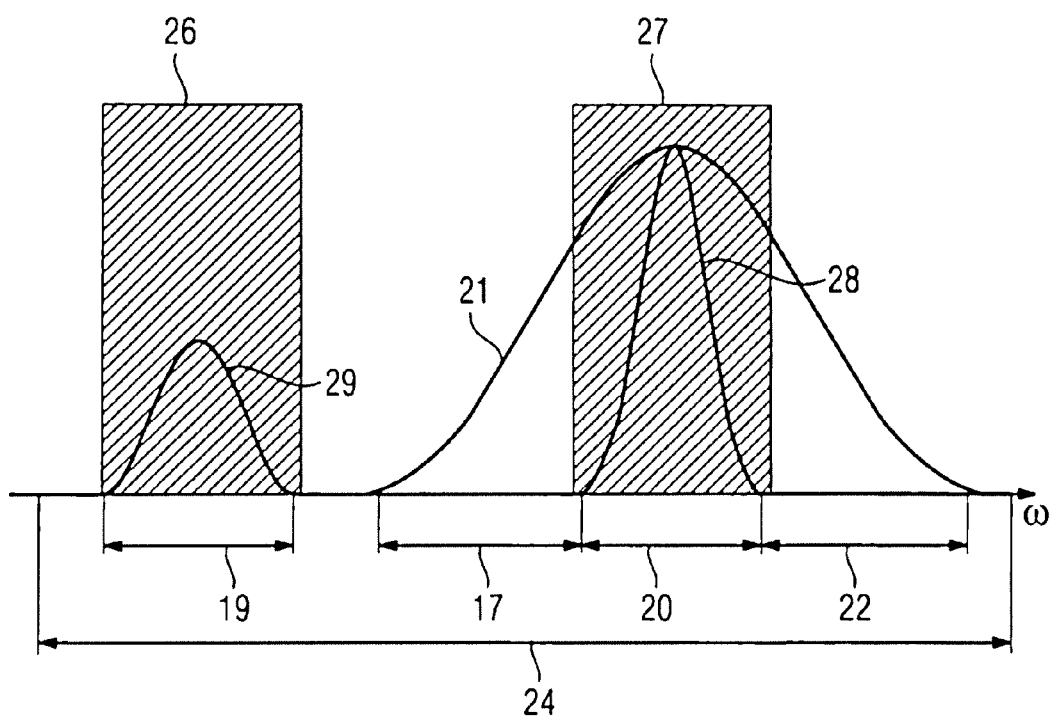
FIG. 4 is a schematic representation of a frequency distribution.

In an emission step 53 a spectrally selective refocusing pulse 16 is subsequently emitted (FIG. 3) to generate a spin echo in non-resonant refocusing frequency range 17 (FIG. 4). The refocusing pulse 16 is formed by a 180° pulse that produces a 180° rotation of the spins of the protons so that the sign of the magnetization of the spins inverts in the y-direction. Both the emission of the excitation pulse 15 and the emission of the refocusing pulse 16 are controlled by the control unit 12. After the emission step 53 to emit the refocusing pulse 16, an acquisition step 54 ensues with regard to a signal acquisition 18 of the spin echo (FIG. 3). In a reconstruction step 55 image data for a magnetic resonance image are reconstructed from data of the magnetic resonance measurement by means of the control unit 12. Only the signal from the refocused regions is to be seen in these image data.

A frequency distribution that covers a frequency range with a resonance frequency range 19 of hydrogen atoms bound in fat molecules and a resonance frequency range 20 of hydrogen atoms bound in water molecules is shown in FIG. 4. The resonance frequency range 20 of the hydrogen atoms or protons bound in water is expanded due to an interference signal 21 that is caused by magnetically active particles located within the basic magnetic field $B_0$, which particles cause or generate an interference field in the form of a dipole field. In order to differentiate the signals caused by the interference field and resonance signals 28 of the hydrogen atoms or protons bound in water, the refocusing pulse 16 is limited to a refocusing frequency range 17, 22 in addition to the resonance frequency range 20. The refocusing frequency range 17, 22 is thereby spectrally selectively limited to a frequency range directly adjacent to the resonance frequency range 20 to generate a spin echo in the non-resonant refocusing frequency range 17, 22. Only the signals from the non-resonant refocusing frequency range 17, 22 thus contribute to the measured signal, such that a large contrast range is covered in the magnetic resonance images resulting from these. The non-resonant refocusing frequency range 17, 20 can contain frequencies that are higher or lower than resonance frequencies of the resonance frequency range 19, 20.

After the acquisition of the first spin echo signal due to the first refocusing pulse 16, the emission step 53 follows again and a second refocusing pulse 23 is generated and sent out. The new refocusing pulse 23 covers a non-resonant refocusing frequency range 22 that is different than the first non-resonant refocusing frequency range 17. For example, the first refocusing pulse 16 can cover the refocusing frequency range 17 to the left of the resonance frequency range 20 from FIG. 4 and the second refocusing pulse 23 can cover the refocusing frequency range 22 to the right of the resonance frequency range 20. The first refocusing pulse 16 can additionally be formed by a spectrally selective refocusing pulse 16 with a refocusing frequency range 17, 22 to the left or right of the resonance frequency range, and the second refocusing pulse 23 can be formed by a broadband refocusing pulse 23. The broadband refocusing pulse 23 covers a refocusing frequency range 24 that comprises both the non-resonant frequency range 17, 22 and the resonance frequency ranges 19, 20 so that an anatomical contrast can be detected. The spectrally selective refocusing pulse 16 can additionally encompass both non-resonant refocusing frequency ranges 17, 22 with refocusing frequencies that are both higher and lower than resonance frequencies of the resonance frequency range 20.

As an alternative, it is possible at any time that three or more refocusing pulses 16, 23 that at least partially cover a spectrally selective refocusing frequency range 17, 22, 24 are generated and emitted after the excitation pulse 15. For example, the first two refocusing pulses 16, 23 can exhibit a refocusing frequency range 17, 22 to the left or right of the refocusing range 20 and a third refocusing pulse can be formed by a broadband refocusing pulse. Multiple spin echoes can be generated and acquired by means of an excitation pulse 15 that respectively have a respective, at least partially different refocusing frequency range 17, 22, 24. Image data for magnetic resonance images with a respective different spectral range can be reconstructed from these multiple spin echoes by the control unit 15.

After the new emission step 53 to emit the second refocusing pulse 23, the acquisition step takes place again for signal acquisition 26 of the second spin echo and the reconstruction step 55 takes place again to reconstruct a second magnetic resonance image.

With regard to a contrast enhancement of the individual magnetic resonance images, combined image data can be acquired from at least two different, spectrally selective refocusing pulses 16, 23 by means of the control unit 12. For this the image data of the different, spectrally selective refocusing pulses 16, 23 are added or subtracted by the control unit 12 and a new image data set is reconstructed so that a large contrast spectrum is generated in the reconstructed magnetic resonance images.

In addition to a broadband excitation pulse 15, it is also possible that in the excitation step 52 the excitation pulse 15 is spectrally selectively limited to a non-resonant frequency range that is essentially formed by one of the resonance frequency ranges 17, 22.

Furthermore, it is possible that suppression pulses 26, 27 (that are represented by a shaded region in FIG. 4) are generated in addition to the refocusing pulses 16, 23. The suppression pulses 26, 27 at least partially suppress signals of the resonance frequency range 19, 20, in particular of the resonance frequency range 20 of the hydrogen atoms bound in water. By means of the suppression pulses the resonance signals 28 of the protons bound in water molecules and/or resonance signals 29 of the protons bound in fat molecules are inverted. This advantageously takes place before an emission of the excitation pulse 15.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating an image that represents a particle that is located in an examination subject, comprising the steps of:
    placing an examination subject, in which a particle is located, in a magnetic resonance data acquisition unit and generating a basic magnetic field in said data acquisition unit that causes said particle to generate a magnetic interference field;
    operating said magnetic resonance data acquisition unit to acquire magnetic resonance data from the subject by executing a pulse sequence that comprises a broadband excitation pulse that generates a transverse magnetization in the examination subject with respect to a magnetization produced by said basic magnetic field, so as to excite nuclear spins in the examination subject;
    in said pulse sequence, following said broadband excitation pulse, generating at least one spectrally selective refocusing pulse in a non-resonant frequency range that causes generation of a spin echo in said non-frequency range by the excited nuclear spins;
    reading out magnetic resonance data from the examination subject during said spin echo in said non-resonant frequency range; and
    in a computerized processor, generating a magnetic resonance image of the examination subject, in which said particle is represented, from said magnetic resonance data, and making said magnetic resonance image available at an output of said processor in electronic form as a data file.

2. A method as claimed in claim 1 comprising generating said spectrally selective refocusing pulse with refocusing frequencies within a refocusing frequency range that is next to a resonance frequency range.

3. A method as claimed in claim 2 comprising generating at least two refocusing pulses, respectively with at least partially differing refocusing frequency ranges, after said excitation pulse.

4. A method as claimed in claim 3 comprising generating combined image data by adding or subtracting respective magnetic resonance data for said at least two refocusing pulses, and generating said magnetic resonance image from said combined image data.

5. A method as claimed in claim 2 wherein said resonance frequency range comprises resonance frequencies of protons bound in water.

6. A method as claimed in claim 2 comprising emitting at least one additional refocusing pulse formed as a broadband refocusing pulse.

7. A method as claimed in claim 1 comprising spectrally selectively limiting said excitation pulse to a non-resonant frequency range.

8. A method as claimed in claim 1 comprising emitting a suppression pulse that at least partially suppresses signals in a resonance frequency range.

9. A method as claimed in claim 1 comprising forming said particle as a magnetically active particle that comprises iron oxide.

10. A magnetic resonance apparatus for generating an image that represents a particle that is located in an examination subject, comprising:
    a magnetic resonance data acquisition unit in which an examination subject is located, with a particle located in said subject, said magnetic resonance data acquisition unit generating a basic magnetic field that causes said particle to generate a magnetic interference field;
    a control unit that operates said magnetic resonance data acquisition unit to acquire magnetic resonance data from the subject by executing a pulse sequence that comprises a broadband excitation pulse that generates a transverse magnetization in the examination subject with respect to a magnetization produced by said basic magnetic field, so as to excite nuclear spins in the examination subject;
    said control unit operating said data acquisition unit to emit, in said pulse sequence, following said broadband excitation pulse, at least one spectrally selective refocusing pulse in a non-resonant frequency range that causes generation of a spin echo in said non-frequency range by the excited nuclear spins;
    said control unit operating said data acquisition unit to read out magnetic resonance data from the examination subject during said spin echo in said non-resonant frequency range; and
    a computerized processor configured to generate a magnetic resonance image of the examination subject, in which said particle is represented, from said magnetic resonance data, and make said magnetic resonance image available at an output of said processor in electronic form as a data file.

* * * * *